United States Patent [19]
Dickinson

[11] Patent Number: 5,521,538
[45] Date of Patent: May 28, 1996

[54] ADIABATIC LOGIC

[75] Inventor: Alexander G. Dickinson, Neptune, N.J.

[73] Assignee: AT&T Corp., Murray Hill, N.J.

[21] Appl. No.: 413,658

[22] Filed: Mar. 30, 1995

[51] Int. Cl.$^6$ ................................................. H03K 19/00
[52] U.S. Cl. .................... 326/93; 326/21; 326/95
[58] Field of Search ......................... 326/21, 93, 95, 326/98

[56] References Cited

U.S. PATENT DOCUMENTS

| | | | |
|---|---|---|---|
| 3,651,340 | 3/1972 | Cliff | 307/251 |
| 4,142,251 | 2/1979 | Mintz | 365/181 |
| 4,985,643 | 1/1991 | Proebsting | 307/443 |
| 5,121,003 | 6/1992 | Williams | 307/452 |
| 5,208,490 | 5/1993 | Yetter | 307/452 |
| 5,378,940 | 1/1995 | Knight, Jr. et al. | 326/98 X |
| 5,396,527 | 3/1995 | Schlecht et al. | 326/93 X |
| 5,422,582 | 6/1995 | Avery et al. | 326/95 |
| 5,426,382 | 6/1995 | Ooms et al. | 326/95 |

OTHER PUBLICATIONS

"Hot Clock nMOS", C. L. Seitz et al., 1985 Chapel Hill Conference on VLSI, pp. 1–17.
"High Speed Dynamic Circuits Implemented With GaAs MESFETS", L. Yang et al., GaAs IC Symposium, 1987, pp. 261–264.
"Low–Power CMOS Digital Design", IEEE Journal of Solid State Circuits, vol. 27, No. 4, Apr. 1992, pp. 473–484.
"Adiabatic Switching, Low Energy Computing and the Physics of Storing and Erasing Information", Aug. 5, 1992.
"Reversible Electronic Logic Using Switches", R. C. Merkle, 1990.
"Practical Implementation of Charge Recovering Asymptotically Zero Power CMOS", S. G. Younis and T. Knight, Oct. 9, 1992, pp. 1–15.
"Recovered Energy Logic, A Highly Efficient Alternative to Today's Logic Circuits", IEEE 1993, pp. 17–26.

*Primary Examiner*—David R. Hudspeth
*Attorney, Agent, or Firm*—Eugene S. Indyk

[57] ABSTRACT

Clocked low power logic circuitry with static inputs and outputs is adiabatically operated. A variety of logical functions is achieved without complex circuitry or unusually configured devices. This logic circuitry can be configured to perform a variety of logical and storage functions.

1 Claim, 4 Drawing Sheets

ADIABATIC LOGIC

CROSS-REFERENCE TO RELATED APPLICATIONS

Application Ser. No. 08/069,926 of Alex G. Dickinson, entitled Adiabatic Dynamic Logic, filed May 28, 1993.

Application Ser. No. 08/069,944 of John S. Denker, entitled Adiabatic Dynamic Noninverting Circuitry, filed May 28, 1993.

Application Ser. No. 08/069,944 of John S. Denker, entitled Adiabatic Dynamic Precharge Boost Circuitry, filed May 28, 1993.

Application Ser. No. 08/175,709 of Steven C. Avery, Alex G. Dickinson, Thaddeus J. Gabara and Alan H. Kramer, entitled Diode Coupled CMOS Logic Design for Quasi-Static Resistive Dissipation With Multi-Output Capability, filed Dec. 30, 1993.

TECHNICAL FIELD

This invention relates to logic circuitry. More specifically, this invention relates to logic circuitry having low power consumption and simplified topology.

BACKGROUND

In standard logic circuitry, such as static and dynamic CMOS logic, nodes are charged and discharged in a completely irreversible, dissipative manner, using a switch to charge a node to a first potential and to discharge the node to a second potential. It has been proposed to attach such a node to a slew rate limited clock which in theory gradually, adiabatically, and reversibly charges and discharges the node. Logic circuitry using this technique is currently too complicated and uses too many transistors so that, at normal speeds of operation, any power savings for each transistor may be lost by the fact that many more transistors are used to accomplish simple logical operations. In addition, it has not been possible to completely avoid nonadiabatic transitions in some prior designs. The total power consumption of the entire circuit thus may not be much less than that used by nonadiabatic circuitry.

SUMMARY

The patent applications cross-referenced above disclose and claim adiabatic dynamic logic circuitry which has low power consumption and reduced complexity. Applicant has developed additional novel logic circuitry which has certain characteristics of dynamic logic circuitry and certain characteristics of static logic circuitry. This logic circuitry has reduced power dissipation and reduced complexity comparable to that of the dynamic logic circuitry disclosed and claimed in the cross-referenced applications. In specific examples of this invention, logic circuitry is clocked like dynamic circuitry, but the logical outputs of this circuitry are static and do not change unless the inputs to the circuitry changes. Various logical functions, such as an inverting function, a NAND function, a NOR function, and compound functions, may be implemented in accordance with specific examples of this invention. Applicants also demonstrate how shift registers and storage elements may be implemented in accordance with the principles of this invention.

In accordance with one example of the invention, an electronic circuit includes an input node and an output node. The input node carries signals varying between two potentials in an adiabatic fashion without substantial dissipative energy losses. The output node carries corresponding output signals varying between two potentials in a similar adiabatic fashion. The nature of the signals carried by the input and output nodes is such that they may signify at least two possible logical states or levels. The electronic circuit in accordance with this example of the invention also has a clock node which may be connected to an energy source which produces at least one clock signal varying between two potentials in an adiabatic fashion. The electronic circuit also contains a means for selectively permitting current flow between the clock node and the output node to selectively charge the output node during predetermined portions of the clock signal in response to the state of the input signal. This means also selectively prevents current flow between the output node and the clock node to selectively prevent discharge of the output node in response to the state of the input signal. The input signal may be prevented from making transitions between potentials at certain times in the cycle of the clock signal to enhance the adiabatic nature of the electronic circuit. Complete logic families have been developed based upon the concepts described above.

Reduced power consumption by up to an order of magnitude or more may be achieved as compared with prior logic circuitry. Adiabatic computing using logic circuitry in accordance with this invention is expected to have a great impact on a wide range of applications from battery powered products to high performance systems where power dissipation is an important consideration.

DETAILED DESCRIPTION

Figure 1:
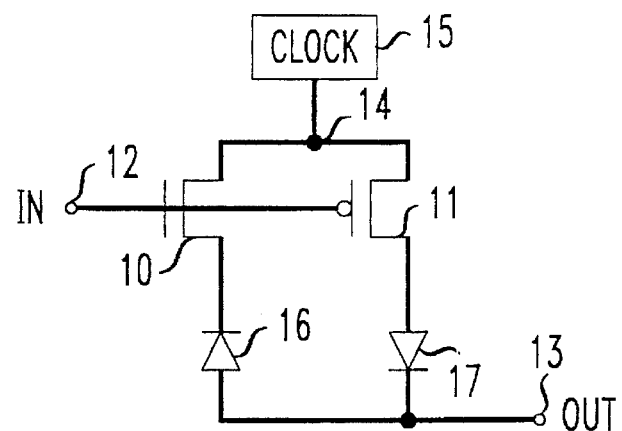
FIG. 1 is a schematic diagram of an example of an adiabatic inverter in accordance with this invention.
Figure 2:
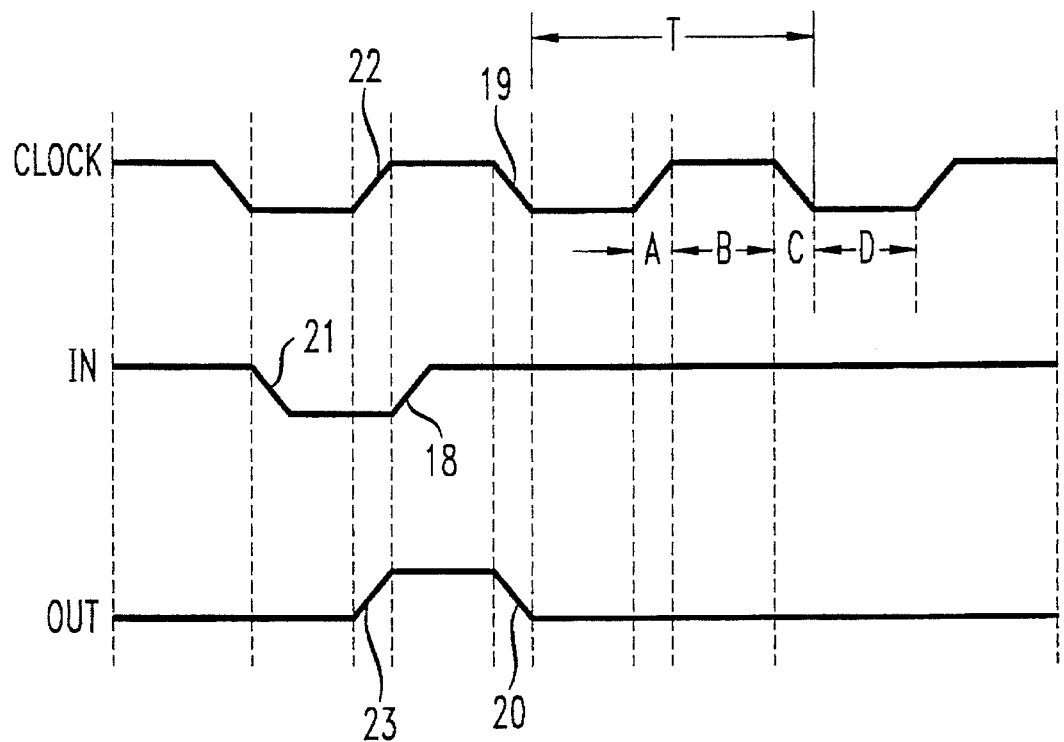
FIG. 2 is a timing diagram showing the input, the output, and the clock voltages associated with the inverter of FIG. 1.

FIG. 1 shows one example of a logic gate in accordance with this invention. The gate shown in FIG. 1 is an inverter and comprises a logic element in the form of two controllable switches, which FIG. 1 shows as an n-channel FET 10 and a p-channel FET 11 normally used in conventional CMOS circuitry. The inverter of FIG. 1 has an input node 12, an output node 13, and a clock node 14. The gates or control terminals of the FETs 10 and 11 are connected to the input node 12. The clock node 14 of the FIG. 1 circuit is connected to a clock signal generator 15 which produces a clock signal, the waveform of which is represented by the top waveform in FIG. 2. The input node is connected to a signal source which produces an input signal which may have one of two potentials representing two possible input logic levels. Transitions between input logic levels may involve transitions between the two predetermined potential levels. As shown in FIG. 2, the input signal may make transitions between the two logic levels adiabatically, namely, at a reduced voltage rate of change which minimizes energy dissipation in the circuit of FIG. 1.

Specifically, a signal or a node in this invention makes an adiabatic transition from one state to another state when the energy dissipated in the apparatus which causes the transition is substantially smaller than the energy difference between the two states. For example, if the energy difference between one logic level and another logic level is ½ $CV^2$, where C is the effective capacitance associated with a node and V is the voltage or potential change taking place as a result of the node making a transition from one logic level to another logic level, the transition from one logic level to another is adiabatic if substantially less than ½ $CV^2$, such as ¼ $CV^2$ to as low as 1/20 $CV^2$ or less, is dissipated in connection with making the transition.

One output terminal of each of the FETs 10 and 11 is connected to the clock node 14 which is connected to the clock signal source 15 described above. As shown in FIG. 2, the clock signal from the source 15 varies between two states or potential levels. Like the input signal variations, the clock signal variations occur at an adiabatic reduced rate of change to minimize energy dissipation in the circuit of FIG. 1.

The output node 13 carries an output signal which has one of two possible output logic levels. Like the input signal and the clock signal, transitions of the output signal between logic levels involves transitions between two predetermined potentials. Transitions between output logic levels occur in a nondissipative adiabatic fashion similar to that occurring in connection with transitions of the input signal and the clock signal. A diode 16 is connected between the other of the output terminals of the FET 10 and the output node 13 as shown in FIG. 1. Another diode 17 is connected between the other output terminal of the transistor 11 and the output node 13. Although FIG. 1 shows the controllable switches 10 and 11 as being FETs, any controllable switch, such as bipolar transistors, may be used in a corresponding circuit configuration to achieve the function of an inverter in accordance with this invention.

FIG. 2 is a timing diagram illustrating the operation of the logic gate of FIG. 1. When a signal appearing at the input terminal of the logic gate is at a high level, which can be a substantially constant voltage level or potential of a predetermined magnitude, the signal appearing at the output terminal of the logic gate is at a low level, which can be another substantially constant voltage level or potential of a predetermined magnitude. Conversely, when a signal appearing at the input terminal of the logic gate is at a low level, the signal appearing at the output terminal is at a high level. As shown in FIG. 2, when the input signal changes from a low level to a high level, as shown at reference numeral 18, the output signal follows the next trailing edge 19 of the clock signal downwardly to a low level, as shown at reference numeral 20. The output signal remains at a constant (static) low level as long as the input signal is high, regardless of further variation in the clock signal level. If the input signal goes from high to low, as shown at reference numeral 21, then the output signal follows the clock upwardly as shown at reference numeral 23 to a high level on the next leading edge 22 of the clock pulses. The output signal remains at a constant (static) high level as long as the input signal continues to be low, regardless of further variation in the clock signal level.

FIG. 2 illustrates the nature of the adiabatic clocking signal applied to the logic gate of FIG. 1. The clocking signal is a repetitive signal having a predetermined period T. The clocking signal begins at a low level and increases gradually to a high level during a period labeled A in FIG. 2. The clock then remains at a high level for a certain period of time labeled B in FIG. 2. This period of time can be any predetermined amount of time, even zero. The clock signal then gradually returns to a low level during a period labeled C in FIG. 2. The clock signal remains at a low level during a predetermined time period labeled D in FIG. 2, after which the previously described cycle is repeated. Although a trapezoidally shaped clock signal is shown here, it could be just as easily a similarly shaped waveform such as a sinusoidal waveform. An advantage of a sinusoidal waveform is that it may easily be produced by conventional LC oscillator circuitry.

A logic circuit such as the one shown in FIG. 1 may be approximated by simple series resistance-capacitance (RC) circuits in analyzing its response to switching signals such as the input logic signal and the clock signal shown specifically in FIG. 2. If an input signal applied to the circuit of FIG. 1 were to make a rapid change from one voltage level to another voltage level, then a voltage spike will appear across the series resistance in the RC circuit immediately after the voltage change. This voltage spike is gradually reduced over time due to the charging or discharging of the series capacitance in the RC circuit. Because of the voltage across the resistance, power is irretrievably dissipated in that resistance during the voltage spike. If the signals in the circuit of FIG. 1 could be slew rate limited to such an extent that the voltage across the capacitance could closely track the changes in the switching voltage, then the power dissipation through the resistance can be minimized. Accordingly, the slope of the signals in the circuit of FIG. 1, such as the input signal and the clock signal, is reduced such that the circuit of FIG. 1 operates in an adiabatic fashion. Specifically, the slopes are gradual enough so that capacitances associated with the circuit of FIG. 1 are able to charge and discharge in substantial conformance with the changing voltage signals. For example, the time for the clock or other changing signal to reach a high state from a low state, or vice versa, ("the ramp time") may be greater than the time constant of the previously mentioned RC circuit. In one particular example of this invention, the ramp time may be at least ten times the time constant. This will mean that there are minimal voltages appearing across resistances found in the charging and discharging paths connected to the changing signal. This also will mean that there is minimal energy dissipation during the charging and discharging created by the operation of the changing signal. This will ensure that state transitions on the input and output nodes of the circuit of FIG. 1 will be adiabatic, namely, the energy irretrievably dissipated in the apparatus will be substantially less than the energy difference between the two states.

In order to preserve as much of the adiabatic nature of logic circuitry such as the inverting gate shown in FIG. 1, the input signals are substantially prevented from making sudden transitions from one state to another. They may also be prevented from making any state changes during predetermined portions of the clock signal of FIG. 1. For example, the input signals may be constrained to make transitions from one logic state or level to another logic state or level only when the clock signal is low (period D, for example) in the case of input transitions from high to low and only when the clock signal is high (period B, for example) in the case of input transitions from low to high. Most preferably, the signals in circuits in accordance with this invention are only allowed to change from one potential to another such that a switch does not close when there is substantial voltage across the switch and a switch does not open when there is substantial current is flowing through it. If this rule is followed, then in some instances it is not required to greatly limit the rate of change of certain signals to preserve the adiabatic nature of the operation of that circuitry. For example, if the input signals to controlled switches, such as the FETs 10 and 11 in FIG. 1, are constrained to change state only when there is no voltage across the output terminals of those controlled switches, then there does not have to be a great deal of restriction on the rate of change of those input signals for adiabatic operation to be obtained.

Figure 3:
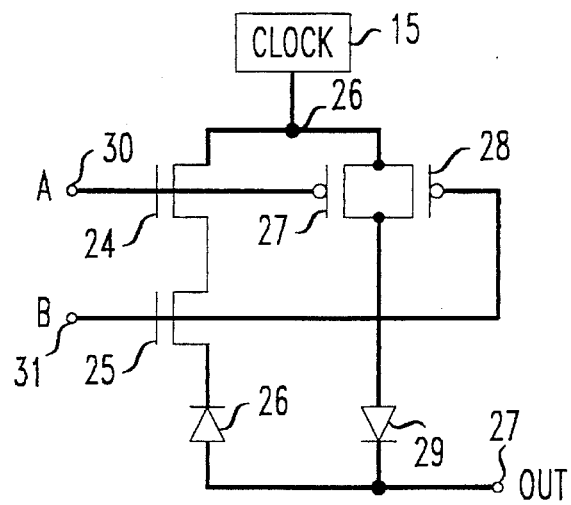
FIG. 3 is a schematic diagram of an adiabatic NAND gate in accordance with this invention.

FIG. 3 illustrates a representative NAND gate constructed in accordance with the principles of this invention. The NAND gate comprises two series connected controllable switches in the form of n-channel FETs 24 and 25 connected in series with a diode 26 between a clock node 26 and an output node 27. The circuit of FIG. 3 also includes a parallel connected combination of two p-channel FETs 27 and 28. The parallel combination of FETs 27 and 28 are connected in series with a diode 29 between the clock node 26 and the output node 27. The clock node 26 is connected to a source 15, as described above. The circuit of FIG. 3 performs a NAND operation on two input signals A and B directed to respective input nodes 30 and 31 connected to the control terminals of the FETs 24, 25, 27, and 28, as shown in FIG. 3. The result of this logical operation appears on the output terminal 27. Gates capable of performing the NAND operation for more than two input signals A and B may be constructed by providing additional controllable switches. Each input involved in the NAND operation is directed to a respective input node and corresponding control terminal of each of the controllable switches. Although the NAND gate of FIG. 4 is shown to involve FETs, other kinds of controllable switches may be used, including NPN and PNP bipolar transistors and the like.

Figure 4:
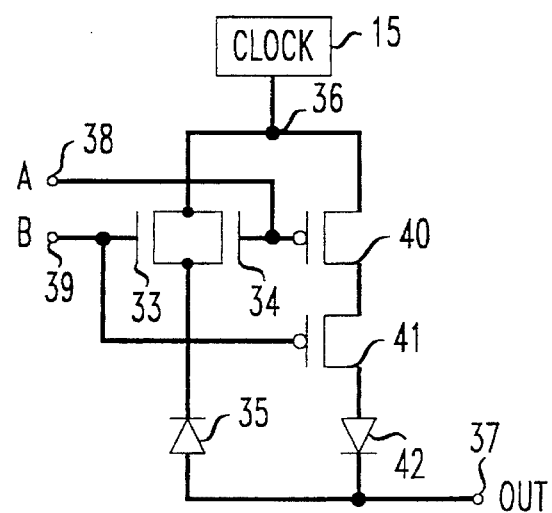
FIG. 4 is a schematic diagram of an adiabatic NOR gate in accordance with this invention.

FIG. 4 shows a representative NOR gate constructed in accordance with the principles of this invention. The NOR gate of FIG. 5 comprises a pair of parallel connected controllable switches, such as a pair of n-channel FETs 33 and 34, connected in series with a diode 35. This combination of the switches and the diode is connected between a clock node 36 and an output node 37. A series combination of a p-channel FET 40, a p-channel FET 41, and a diode 42 also is connected between the clock node 36 and the output node 37. A clock signal similar to the clock signals in the circuitry of FIGS. 1 and 3, is directed to the clock 36 node in FIG. 4. The circuit of FIG. 4 produces an output signal at node 37 which is a logical NOR of the two input signals A and B directed to respective input nodes 38 and 39 of the NOR gate in FIG. 4. Although the NOR gate of FIG. 4 uses FETs as switching devices, NOR gates using other kinds of controllable switches may be used in place of the FETs 33, 34, 40, and 41, including NPN and PNP bipolar transistors and the like.

Figure 5:
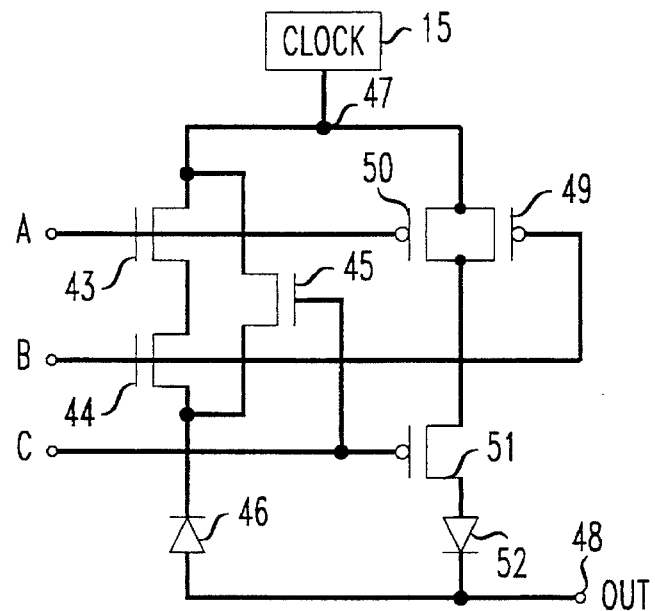
FIG. 5 is a schematic diagram of an adiabatic NAND/NOR gate in accordance with this invention.

FIG. 5 illustrates an adiabatic logic circuit in accordance with this invention which performs compound logical operations on a set of input signals A, B, and C. The circuit of FIG. 5 comprises two series connected n-channel FETs 43 and 44 in parallel with an n-channel FET 45. A diode 46 is connected in series with this combination of three FETs. The three FETs 43–45 and the diode 40 are connected between a clock node 47 and an output node 48. In addition, the circuit of FIG. 5 includes two parallel connected p-channel FETs 49 and 50 in series with a p-channel FET 51. The three FETs 49–51 are connected in series with a diode 52 between the clock node 47 and the output node 48. A clock signal is directed to the clock node 47. The clock signal is similar to the clock signals directed to the clock nodes of the other logic circuits described above. The circuit of FIG. 5 produces an output signal at output node 48 which is the logical function $\overline{A \cdot B + C}$ of the input signals A, B, and C applied to input nodes of the FIG. 5 device. Other controllable switches may be used in place of the FETs shown in FIG. 5.

Figure 6:
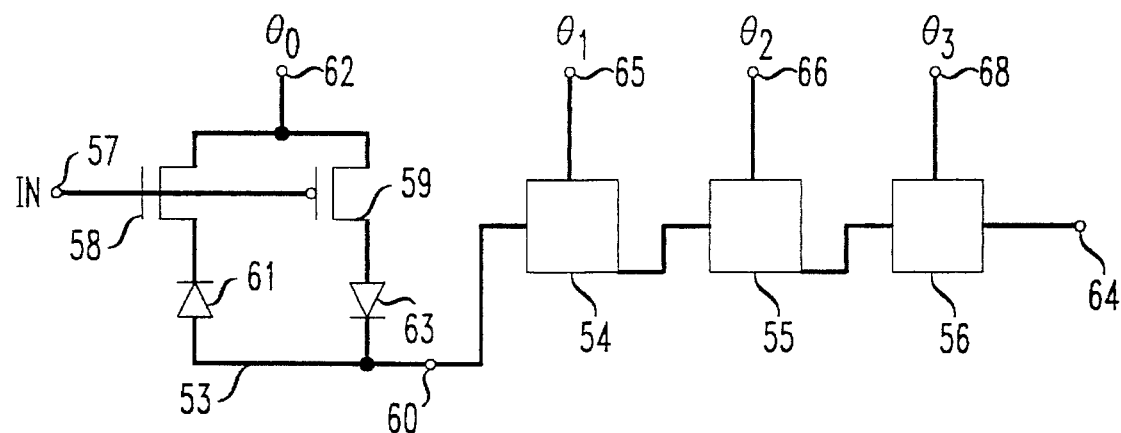
FIG. 6 is a schematic diagram of a multiple stage adiabatic logic circuit in accordance with this invention.

FIG. 6 shows an example of a logic circuit using previously described adiabatic logic building blocks. The circuit of FIG. 6 comprises four inverter stages 53, 54, 55, and 56 in series functioning as a shift register. Stage 53 is shown in detail in FIG. 6 and is an inverter similar to the inverter shown in FIG. 1. It comprises an input node 57 connected to the control terminal of an n-channel FET 58 and a p-channel FET 59. A diode 61 connects one output terminal of the FET 58 to an output node 60 of the inverter 53. Another output terminal of the FET 58 is connected to a clock node 62. The clock node 62 is connected to an energy source producing a clock signal $\Phi_0$ similar to the clock signal in the circuit of FIG. 1. This clock signal is depicted as the topmost waveform $\Phi_0$ shown in FIG. 7. A diode 63 connects one output terminal of the FET 59 to the output node 60. The other output terminal of FET 59 is connected to the clock node 62.

Each of the inverters 54, 55, and 56 is identical to the inverter 53. The output node 60 of the inverter 53 is connected to the input node of the inverter 54. The output node of the inverter 54 is connected to the input node of the inverter 55, the output node of the inverter 55 is connected to the input node of the inverter 56, and the output node of the inverter 56 is connected to an output 64 of the shift register of FIG. 6.

Figure 7:
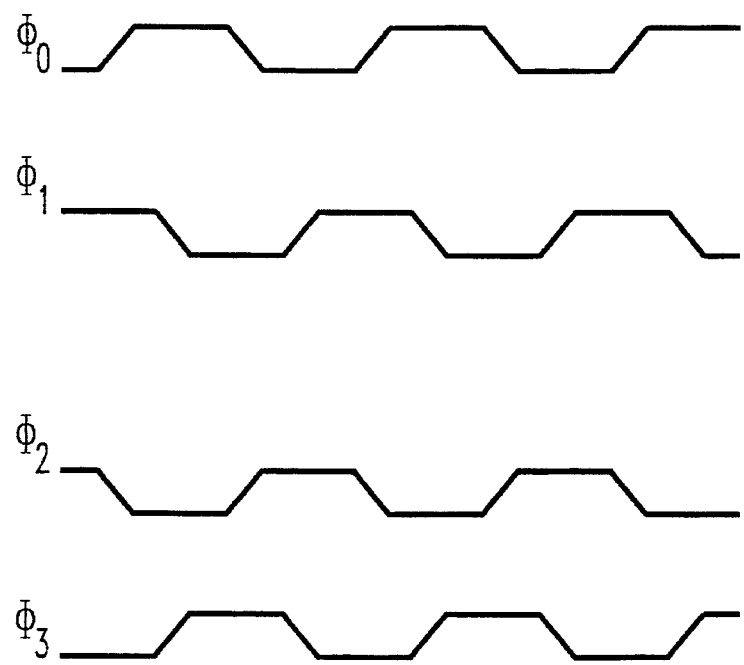
FIG. 7 is a timing diagram showing the clock voltages for the multiple stage logic circuit shown in FIG. 6.

A clock node 65 is connected to the output terminals of the FETs in the inverter 54 and receives a clock signal $\Phi_1$ produced by an energy source. The clock signal $\Phi_1$ is similar to the clock signal $\Phi_0$ for the inverter 53 shown in FIG. 7 and is specifically shown in FIG. 7 as the waveform second from the top labeled $\Phi_1$. The clock signal $\Phi_1$ in this example of the invention is delayed by three quarters of a clock cycle with respect to the clock signal $\Phi_0$. A clock signal $\Phi_2$ shown in FIG. 7 is directed to the clock node 66 of the inverter 55. The clock signal $\Phi_2$ is delayed by three quarters of a clock cycle with respect to the clock signal $\Phi_1$. (The clock signal $\Phi_2$ thus is the inverse of the clock signal $\Phi_0$). A clock signal $\Phi_3$ is directed to the clock node 68 of the inverter 56. The details of the clock signal $\Phi_3$ are shown as the bottom most waveform in FIG. 7. The clock signal $\Phi_3$ is delayed by three quarters of a clock cycle with respect to the clock signal $\Phi_2$. Although FIG. 7 shows that they are not connected, it should be pointed out that the output 64 can be safely connected to the input node 57 of the inverter 53.

Figure 8:
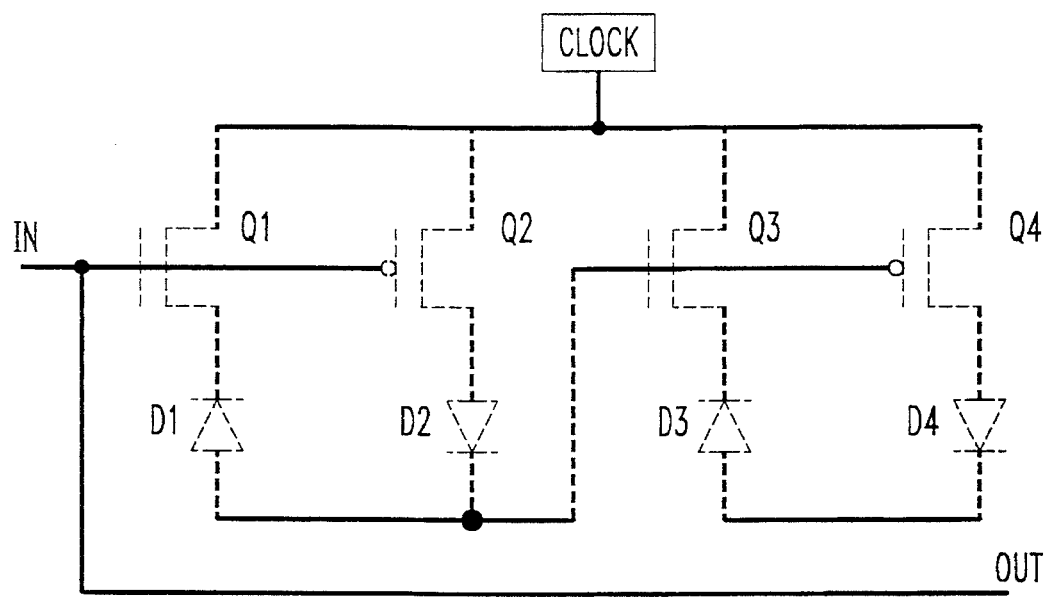
FIG. 8 is a schematic diagram of a storage element in accordance with this invention.

FIG. 8 shows a storage element in accordance with this invention. The storage element comprises two inverters like the one shown in FIG. 1. The inverters are both connected to a common clock signal produced by a clock signal generator like the clock signal generator 15 shown in FIG. 1. The output node of the inverter comprising n-channel FET Q1, p-channel FET Q2, diode D1, and diode D2 is connected to the input node of the inverter comprising n-channel FET Q3, p-channel FET Q4, diode D3, and diode D4. The output node of the Q3, Q4, D3, D4 inverter is fed back to the input node of the Q1, Q2, D1, D2 inverter.

Figure 9:
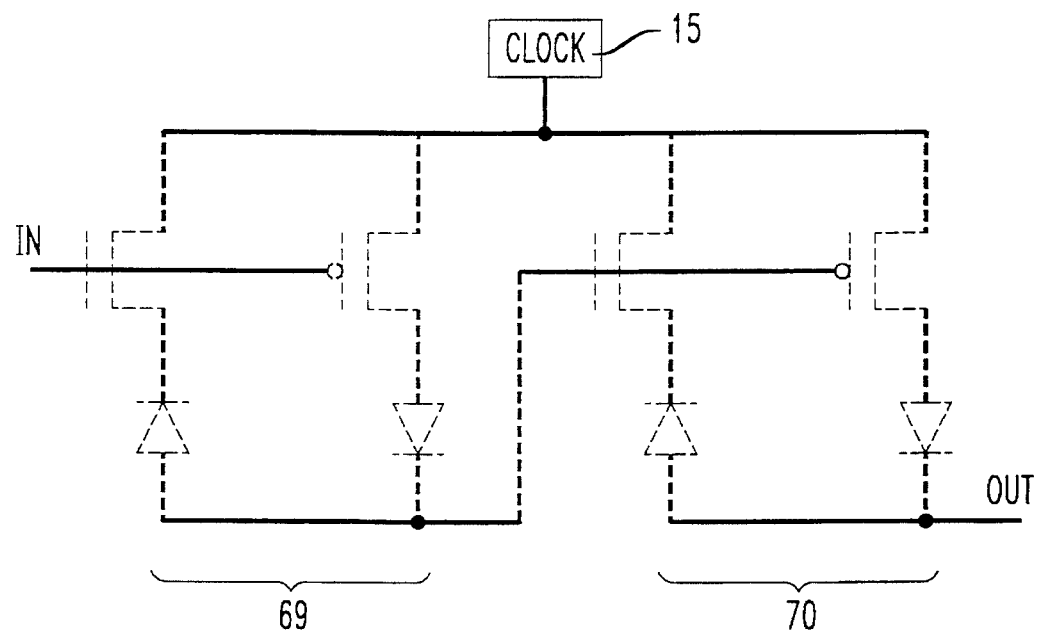
FIG. 9 is a schematic diagram of a non-inverter in accordance with this invention.

In some instances, it is desirable to have a given logic level which is valid and usable at the same time that its inverse logic level is valid and usable. This can be achieved by a noninverter circuit in accordance with the principles of this invention, as shown in FIG. 9. The noninverter of FIG. 9 comprises two series connected inverters 69 and 70, each of which is the same as the inverter shown in FIGS. 1 and 2. Both inverters 69 and 70 are connected to a common clock, which is the same as the clock signal generator 15 in FIGS. 1 and 2. The output of the inverter 70 is a non-inverted version of the input to the inverter 69.

In all of the examples of the invention described above, the logic circuitry is simple and has vastly reduced power dissipation.

I claim:

1. A logic circuit, comprising:

an input node for receiving an input signal which is variable between first and second input logic levels;

an output node for producing an output signal which is variable between first and second output logic levels;

a clock node for receiving a clock signal adiabatically varying between first and second potentials, the clock signal defining a first period during which the clock signal adiabatically changes from the first potential to the second potential and a second period during which the clock signal adiabatically changes from the second potential to the first potential;

a first path between the clock node and the output node which permits the output signal to adiabatically follow the change of the clock signal from the first potential to the second potential when the input signal is at the first input logic level until the output signal reaches the second output logic level, the output signal remaining at the second output logic level as long as the input signal is at the first input logic level, regardless of any further change by the clock signal; and a second path between the clock node and the output node which permits the output signal to adiabatically follow the change of the clock signal from the second potential to the first potential when the input signal is at the second input logic level until the output signal reaches the first output logic level, the output signal remaining at the first output logic level as long as the input signal is at the second input logic level, regardless of any further change by the clock signal.

\* \* \* \* \*